United States Patent
Hur et al.

(10) Patent No.: US 9,252,713 B2
(45) Date of Patent: Feb. 2, 2016

(54) BIAS CIRCUITS AND METHODS FOR STACKED DEVICES

(71) Applicant: QUALCOMM Incorporated, San Diego, CA (US)

(72) Inventors: Joonhoi Hur, San Diego, CA (US); Paul Joseph Draxler, San Diego, CA (US); Calogero Presti, San Diego, CA (US); Marco Cassia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/298,665

(22) Filed: Jun. 6, 2014

(65) Prior Publication Data

US 2015/0244322 A1 Aug. 27, 2015

Related U.S. Application Data

(60) Provisional application No. 61/945,368, filed on Feb. 27, 2014.

(51) Int. Cl.
*H03F 3/04* (2006.01)
*H03G 3/00* (2006.01)
*H03F 1/02* (2006.01)
(Continued)

(52) U.S. Cl.
CPC ............ *H03F 1/0211* (2013.01); *H03F 1/0222* (2013.01); *H03F 1/0266* (2013.01); *H03F 1/223* (2013.01); *H03F 3/19* (2013.01); *H03F 3/193* (2013.01); *H03F 3/21* (2013.01); *H03F 2200/108* (2013.01); *H03F 2200/18* (2013.01);
(Continued)

(58) Field of Classification Search
USPC .......................................... 330/311, 296, 127
IPC ...................................... H03F 3/04; H03G 3/00
See application file for complete search history.

(56) References Cited

U.S. PATENT DOCUMENTS

| 4,317,055 A | 2/1982 | Yoshida et al. |
| 6,377,113 B1 | 4/2002 | Kanno |

(Continued)

FOREIGN PATENT DOCUMENTS

WO 2009060095 A1 5/2009

OTHER PUBLICATIONS

Dehaene W., et al., "A High-Voltage Output Driver in a 2.5-V 0.25-um CMOS Technology", IEEE Journal of Solid-State Circuits, IEEE Service Center, Piscataway, NJ, USA, vol. 40, No. 3, Mar. 1, 2005, pp. 576-583, XP011128261, ISSN: 0018-9200, DOI: 10.1109/JSSC.2005.843599 p. 576, left-hand column, line 17-p. 582, left-hand column, line 4; figures 1,2,3,4,5,10.

(Continued)

*Primary Examiner* — Patricia T Nguyen
(74) *Attorney, Agent, or Firm* — Fountainhead Law Group P.C.

(57) ABSTRACT

Embodiments of the present disclosure include a bias circuit for generating bias voltages to stacked transistors. In one embodiment, stacked transistors are coupled between an input transistor and an output node. A modulated power supply voltage and an input signal produce a voltage at the output node. The modulated power supply voltage is provided as an input to the bias circuit. Bias voltages are generated that change with the power supply voltage. In one embodiment, particular transistors in the stack are biased so that their control terminals are effectively short circuited when the power supply voltage is reduced.

19 Claims, 5 Drawing Sheets

(51) Int. Cl.
*H03F 3/19* (2006.01)
*H03F 3/21* (2006.01)
*H03F 1/22* (2006.01)
*H03F 3/193* (2006.01)

(52) U.S. Cl.
CPC ....... *H03F 2200/451* (2013.01); *H03F 2200/61* (2013.01)

(56) References Cited

U.S. PATENT DOCUMENTS 8,228,125 B2 * 7/2012 Heijden et al. ................ 330/311
2011/0070848 A1 * 3/2011 Ramachandra Reddy . 455/127.2
2013/0285750 A1 10/2013 Chowdhury et al.
2014/0049322 A1 * 2/2014 Jeon et al. ..................... 330/285
2014/0184337 A1 * 7/2014 Nobbe et al. .................. 330/296
2014/0266444 A1 * 9/2014 Scott et al. .................... 330/257
2015/0070095 A1 * 3/2015 Cabanillas et al. ........... 330/296
2015/0097624 A1 * 4/2015 Olson et al. ................... 330/295

OTHER PUBLICATIONS

International Search Report and Written Opinion—PCT/US2015/017652—ISA/EPO—Jun. 3, 2015.

* cited by examiner

BIAS CIRCUITS AND METHODS FOR STACKED DEVICES

CROSS REFERENCE TO RELATED APPLICATIONS

This application claims priority to U.S. Provisional App. No. 61/945,368 filed Feb. 27, 2014, the content of which is incorporated herein by reference in its entirety for all purposes.

BACKGROUND

The present disclosure relates to bias circuits used in electronic systems.

Transistors used in electronic systems to process electrical signals often require precise biasing for proper operation. In some applications, stacked devices configured in cascode are used to divide a power supply voltage across multiple devices to prevent device breakdown and provide other useful operating characteristics. Stacked devices may be biased using fixed voltage sources. However, in some applications fixed voltage biasing of stacked devices is not optimum for circuit performance One particular application where biasing is important is in high speed circuit design, such as in an RF amplifier. The techniques described herein improve biasing of stacked transistors in these and other applications.

SUMMARY

Embodiments of the present disclosure include a bias circuit for generating bias voltages to stacked transistors. In one embodiment, stacked transistors are coupled between an input transistor and an output node. A modulated power supply voltage and an input signal produce a voltage at the output node. The modulated power supply voltage is provided as an input to the bias circuit. Bias voltages are generated that change with the power supply voltage. In one embodiment, particular transistors in the stack are biased so that their control terminals are effectively short circuited when the power supply voltage is reduced.

In one embodiment, the present disclosure includes an electronic device comprising a first transistor having a control terminal configured to receive an input signal, a first terminal coupled to ground, and a second terminal, a plurality of stacked transistors, the plurality of stacked transistors arranged in series between the second terminal of the first transistor and an output node, each of the plurality of stacked transistors comprising a control terminal, an inductor having a first terminal coupled to the output node and a second terminal coupled to a modulated power supply, the modulated power supply producing a time varying power supply voltage, a bias circuit having an input coupled to the modulated power supply to receive the time varying power supply voltage, the bias circuit comprising a plurality of outputs producing a plurality of bias voltages, wherein particular outputs of the bias circuit are coupled to particular control terminals of the plurality of stacked transistors, wherein the power supply voltage is greater than each of the plurality of bias voltages above a first power supply voltage level, and the power supply voltage is less than each of the plurality of bias voltages below a second power supply voltage level.

In one embodiment, as the power supply voltage decreases across a range of levels, the plurality of bias voltages converge to one or more values greater than a lowest level of the power supply voltage.

In one embodiment, the power supply voltage is greater than all of the bias voltages across a first upper range, wherein the power supply voltage is less than all of the bias voltages across a second lower range, and wherein as the power supply voltage decreases between the first upper range and the second lower range, the power supply voltage successively becomes less than each of the plurality of bias voltages.

In one embodiment, the time varying power supply voltage is related to the input signal to produce a particular output voltage on the output node.

In one embodiment, one or more bias voltages change linearly as the power supply voltage changes.

In one embodiment, one or more bias voltages increase monotonically as the power supply voltage increases.

In one embodiment, the plurality of stacked transistors are successively biased in a low impedance triode region of operation as the power supply voltage decreases, and wherein the plurality of stacked transistors are successively biased to have an impedance greater than the low impedance triode region of operation as the power supply voltage increases.

In one embodiment, the bias circuit comprises a first resistor having a first terminal coupled to the modulated power supply and a second terminal coupled to a control terminal of one of the plurality of stacked transistors, a second resistor having a first terminal coupled to the control terminal of said one of the plurality of stacked transistors and a second terminal, a voltage reference coupled to the second terminal of the second resistor.

In one embodiment, the bias circuit further comprises an amplifier configured between the first terminal of the first resistor and the control terminal of the transistor.

In one embodiment, the bias circuit comprises a first resistor having a first terminal coupled to the modulated power supply and a second terminal coupled to a control terminal of one of the plurality of stacked transistors, a second resistor having a first terminal coupled to the control terminal of said one of the plurality of stacked transistors and a second terminal coupled to ground, a third resistor having a first terminal coupled to the control terminal of said one of the plurality of stacked transistors and a second terminal, and a voltage reference coupled to the second terminal of the third resistor.

In one embodiment, the bias circuit comprises a plurality of resistors coupled between the modulated power supply and ground, wherein a control terminal of one of the plurality of stacked transistors is coupled to at least one terminal of the plurality of resistors, and wherein at least one other resistor terminal is coupled to a reference voltage modulated according to the power supply voltage.

In one embodiment, modulated reference voltage is based on a square of the supply voltage.

In one embodiment, modulated reference voltage is based on a square of the supply voltage added to a constant.

In one embodiment, the present disclosure includes a method comprising receiving an input signal on a control terminal of a first transistor, the first transistor including a first terminal coupled to ground and a second terminal coupled to a plurality of stacked transistors arranged in series between the second terminal of the first transistor and an output node, wherein each stacked transistor has a control terminal, receiving a time varying power supply voltage from a modulated power supply on a first terminal of an inductor, the inductor having a second terminal coupled to the output node, receiving the time varying power supply voltage in a bias circuit to produce a plurality of bias voltages, wherein particular bias voltages from the bias circuit are coupled to particular control terminals of the plurality of stacked transistors, wherein the power supply voltage is greater than each of the plurality of bias voltages above a first power supply voltage level, and the power supply voltage is less than each of the plurality of bias voltages below a second power supply voltage level.

The following detailed description and accompanying drawings provide a better understanding of the nature and advantages of the present disclosure.

DETAILED DESCRIPTION

The present disclosure pertains to bias circuits. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
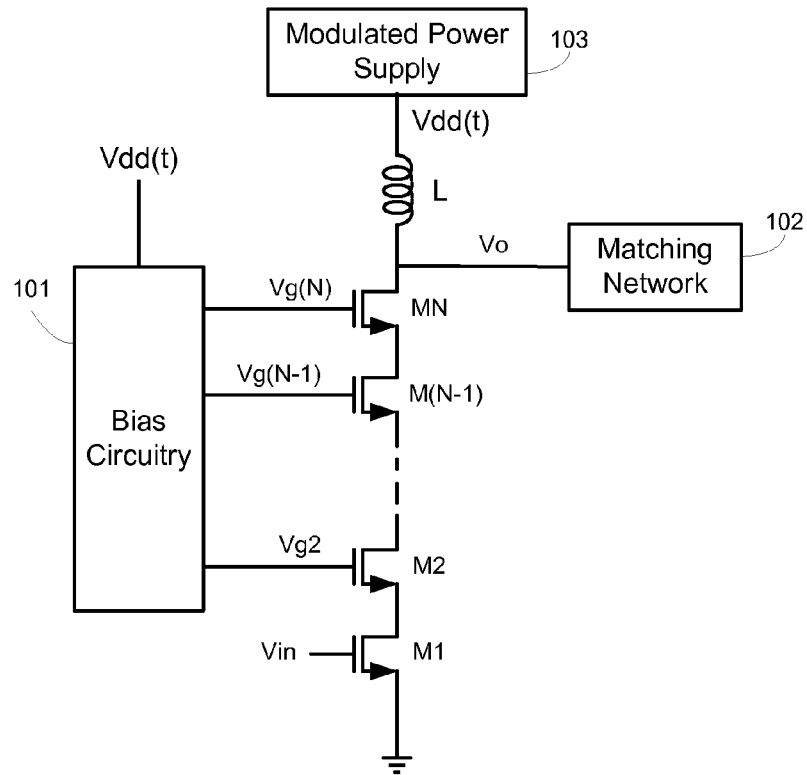
FIG. 1 illustrates an electronic device including a bias circuit for stacked devices according to one embodiment.

CMOS transistors are occasionally stacked in order to split the voltage swing across multiple devices for reliability purposes. FIG. 1 illustrates stacked (or cascode) devices in an amplifier stage. An input signal is applied to the gate of a bottom MOS device M1 (e.g., in common source (CS) configuration). A number of stacked (also referred to as "cascode") devices M2, ..., M(N−1), MN (in common gate (CG) configuration) may be configured between the drain of M1 and a load element (here an inductor L). Each cascode device has a gate that receives a bias voltage Vg2, Vg(N−1), VgN.

In some applications, the power supply voltage may be varied over time. For example, in an RF power amplifier designed to drive an antenna, a modulated power supply 103 may produce a time varying power supply voltage, Vdd(t). In particular implementations, the time varying power supply voltage may be related to the input signal to produce a particular output voltage on the output node. In some embodiments, the supply voltage may be related to the time average of output voltages. The output voltage may correspond to a desired output power to be driven to the antenna, for example. When the power supply voltage changes over time, the voltage across the drain to source of each stacked device may also change. Static gate bias voltages may be suboptimal or unworkable for such applications.

Features and advantages of the present disclosure include bias circuits for stacked devices that optimize the performance of stacked devices as the voltage on the power supply changes over time, Vdd(t). Further example applications where Vdd changes over time include average power tracking (APT) and/or envelop tracking (ET) in wireless system applications, for example, where the power supply of one or more circuits such as an RF power amplifier are not constant.

In FIG. 1, an input signal Vin is received at the gate of M1. Stacked transistors M2-MN are arranged in series between a drain of M1 and an output node for providing an output signal Vo, which may drive a matching network 102, for example. A component, such as a choke inductor L, is configured between the output node and a modulated power supply 103 that produces a time varying power supply voltage Vdd(t). Bias circuits 101 receive Vdd(t) and product a plurality of bias voltages Vg2, Vg(N−1), VgN for biasing the gates of transistors M2, ..., M(N−1), and MN, respectively. Accordingly, as Vdd changes, the gate bias voltages also change.

Embodiments of the present disclosure may produce bias voltage values that are functionally related to Vdd(t). In one embodiment, the bias voltages may increase monotonically as Vdd(t) increases. In one embodiment, the bias voltages may not converge on zero volts as Vdd(t) goes to zero volts. Rather, the bias voltages may converge on one or more minimum gate bias voltages as Vdd(t) converges toward zero volts, for example. In one embodiment, Vdd(t) may be greater than one or more gate bias voltages across an upper range of supply voltages, and across another lower range of supply voltages one or more gate bias voltages may be greater than Vdd(t). In one embodiment, different stacked transistors coupled between an input transistor, such as M1, and an output node may be successively biased in a low impedance triode region of operation as Vdd decreases, and the stacked transistors may be biased to have an impedance greater than the low impedance triode region of operation as the power supply voltage increases. Accordingly, as Vdd decreases, and the need to divide the Vdd voltage across multiple devices is reduced, one or more transistors may be effectively removed from the stack by increasing the gate bias voltage on such device so that there is little or no voltage drop across the source and drain (e.g., the device is "all the way on"). Embodiments of the present disclosure may improve power added efficiency (PAE) in RF power amplifier applications and increase the gain of the power amplifier when power supply voltage is low, for example.

Figure 2:
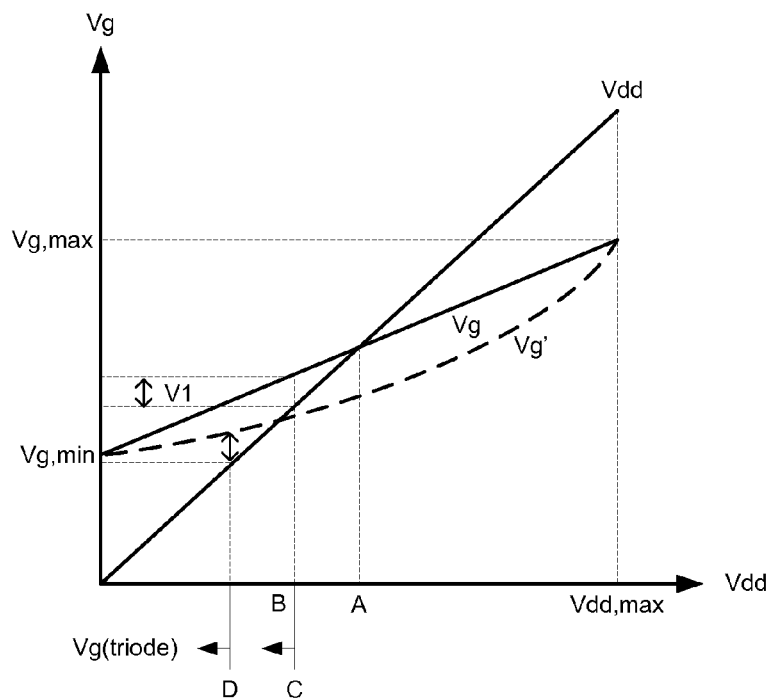
FIG. 2 shows a plot of supply voltage Vdd versus gate bias voltage Vg for a single stacked transistor according to one embodiment.

FIG. 2 illustrates some of the advantages and techniques of the present disclosure. FIG. 2 shows a plot of supply voltage Vdd versus gate bias voltage Vg for a single stacked transistor. Starting at maximum Vdd, a bias circuit may produce a maximum bias voltage Vg,max. As Vdd decreases, bias voltage Vg also decreases. At a supply voltage value denoted in FIG. 2 as voltage A, Vdd and Vg may converge and cross over such that above Vdd voltage A, Vdd is greater than Vg, and below Vdd voltage A, Vdd is less than Vg, for example. Accordingly, across a range of Vdd voltages above voltage A, Vdd>Vg, and across a range of Vdd voltages below A, Vdd<Vg. As illustrated in FIG. 2, as Vdd converges on a minimum value (here, zero volts), Vg converges on a minimum bias voltage value, Vg,min, that is greater than the minimum voltage of Vdd.

FIG. 2 illustrates one advantage of the present disclosure. As illustrated in FIG. 2, below Vdd=A, Vg>Vdd. Accordingly, as Vdd decreases, the bias voltage Vg increases relative to the voltage across a particular stacked device (because as Vdd decreases, the voltage drop across each stacked device decreases). For example, for an MOS transistor, when Vdd decreases to a point where the following conditions apply, the transistor goes into Triode: Vgs>Vt and Vgs−Vt>Vds, where Vgs is the transistor gate to source voltage, Vt is the transistor threshold voltage, and Vds is the transistor drain to source voltage. In triode, the source and drain are approximately short circuited and the voltage drop Vds is nearly zero. The point where Vdd falls sufficiently below Vg to place the transistor in Triode is show in FIG. 2 at C, with the difference between Vg and Vdd labeled V1. Referring to FIG. 1, in one example embodiment bias circuit 101 may successively bias the stacked transistor into triode as Vdd(t) decreases. For example, bias circuit 101 may produce an Nth gate bias voltage Vg(N) such that transistor MN may enter triode first (e.g., Vg(N)>Vdd before any other gate bias voltage is greater than Vdd), the bias circuit may produce an N−$1^{st}$ gate bias voltage Vg(N−1) such that transistor M(N−1) enters triode next (e.g., Vg(N−1)>Vdd after VgN>Vdd but before any other gate bias voltage is greater than Vdd), and so on for the other stacked devices such that the stacked transistors successively enter triode starting at the closest transistor to the output terminal, for example. While this example illustrates turning on (triode) stacked devices successively, other bias circuit embodiments may turn the devices on in a different order or turn on multiple devices at the same time.

More generally, an ith bias voltage, Vgi, may be related to Vdd as any monotonically increasing function with a minimum value as follows: Vgi=fi(Vdd), i=1,2, . . . N, where fi(0)<>0. For the example illustrated in FIG. 2, Vg is linearly related to Vdd as follows: Vgi=Ki*Vdd+Vgi,min, where Ki is the ith slope. FIG. 2 also illustrates another non-linear monotonic functional relation to Vdd. Vg' shows a monotonically increasing curve having the same Vg,min and Vg,max, for example. Vg' crosses Vdd at a different Vdd point B and enters the Triode region at a different Vdd point (Vdd voltage denoted D). It is to be understood that a wide range of non-linear curves could be used to control the bias of different stacked transistors.

Figure 3A:
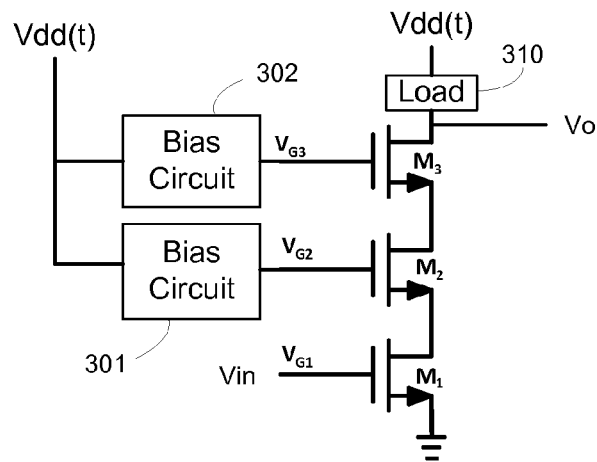
FIG. 3A illustrates an example amplifier including stacked transistors according to one embodiment.

FIG. 3A illustrates an example amplifier including stacked transistors. In this example, M1 is an active common source configured device that receives an input signal Vin, and M2 and M3 are stacked common base configured cascode devices between a drain of M1 and an output node. A load 310 is coupled between the output node and Vdd(t). A first bias circuit 301 receives Vdd(t) and produces a gate bias voltage Vg2 for M2. A second bias circuit 302 receives Vdd(t) and produces a gate bias voltage Vg3 fo M3. Generally, a plurality of bias voltages Vg2,Vg3 . . . VgN may change as functions f1(Vdd), f2(Vdd), fN(Vdd) of the amplifier supply Vdd, but do not go to zero as the amplifier supply goes to zero, for example.

Figure 3B:
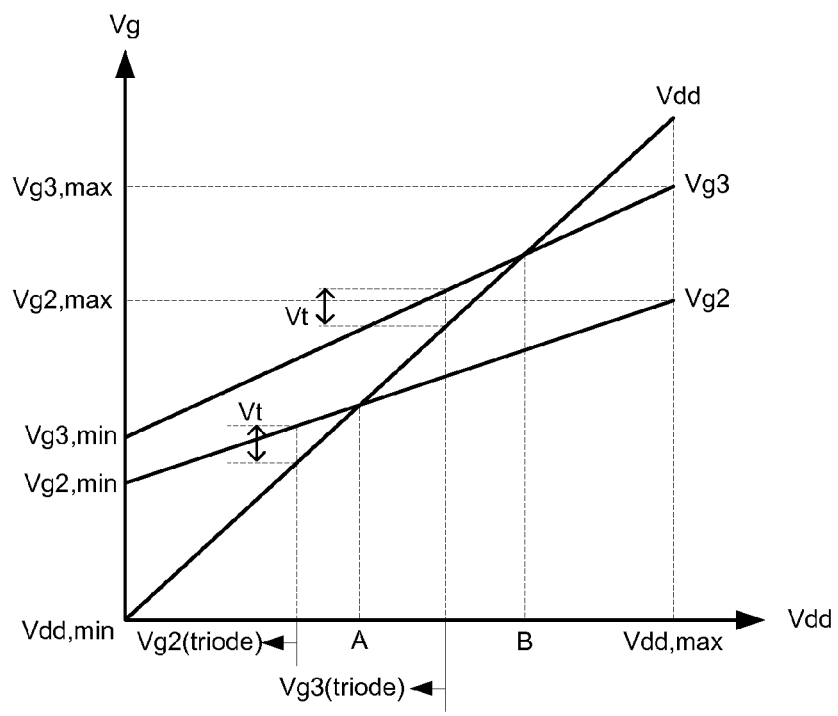
FIG. 3B illustrates the operation of the circuit in FIG. 3A.

FIG. 3B illustrates one possible operation of the circuit in FIG. 3A. This example illustrates that the power supply voltage may be greater than each of the bias voltages above a first power supply voltage level (level B), and the power supply voltage may be less than each of the bias voltages below a second power supply voltage level (level A). At maximum Vdd (Vdd,max), Vg3 is at Vg3max and Vg2 is at Vg2,max, where Vg3>Vg2, for example. As Vdd begins to decrease, Vg2 and Vg3 also decrease. In this example Vg2 and Vg3 have different slopes and different minimum voltages (Vg2, min and Vg3,min). Accordingly, in this example, Vg3 crosses Vdd at a Vdd voltage B which is higher than the Vdd voltage A where Vg2 crosses Vdd. Thus, transistor M3 enters Triode at a higher Vdd voltage than M2. As a result, M3 is effectively removed from the stack (because the source and drain of M3 have approximately the same voltage) before M2. While this example illustrates successively biasing two stacked transistor into triode as the supply voltage decreases, it is to be understood that the same principle could be applied to additional stacked transistors. As the supply voltage drops, the need to divide the supply voltage across multiple devices may no longer be required, and thus such devices may be removed from the stack by dynamically changing the bias to successively short circuit stacked devices as the supply voltage decreases, for example. In this example, Vg2,min and Vg3, min may correspond to a minimum level of Vdd (Vdd,min), for example. In some embodiments, Vdd,min may be non-zero such that the amplifier is never fully turned off. However, as Vdd converges toward zero volts, Vg2 and Vg3 converge toward non-zero values.

Figure 4:
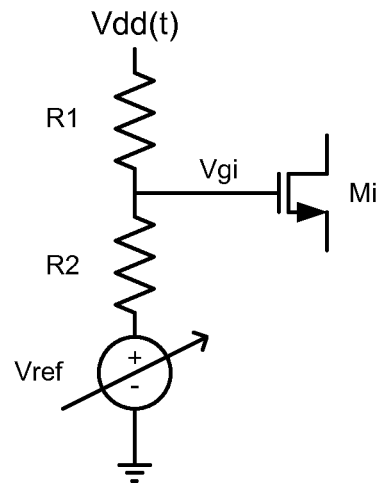
FIG. 4 illustrates a one example of a bias circuit according to one embodiment.
Figure 5:
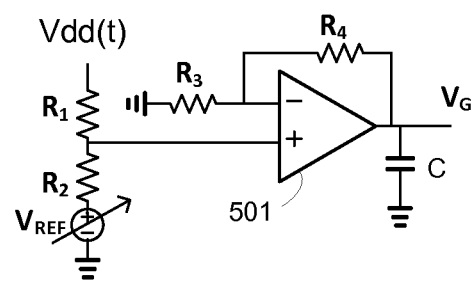
FIG. 5 illustrates another example of a bias circuit according to one embodiment.
Figure 6:
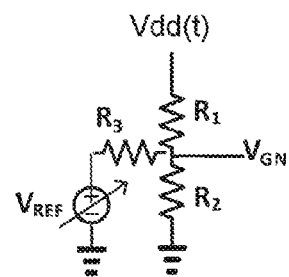
FIG. 6 illustrates another example of a bias circuit according to one embodiment.

FIGS. 4-6 illustrate example bias circuits that may be used for generated bias voltages as described above. FIGS. 4-6 show different example means for receiving the time varying power supply voltage and for producing bias voltages. FIG. 4 illustrates one example embodiment of a bias circuit including resistors R1 and R2 arranged as a voltage divider and a reference voltage Vref configured between a terminal of R2 and ground to set a minimum gate bias voltage, Vg,min. One terminal of R1 receives Vdd(t), a power supply voltage that is not constant, and a second terminal of R1 is coupled to the gate of an ith transistor Mi. A terminal of R2 is coupled to the gate of Mi and a second terminal of R2 is coupled to Vref. In some embodiments, Vref may be a modulated voltage (as illustrated by the arrow), which may correspond to Vdd(t). For example, in an envelope tracking or average power tracking application, Vref may be modulated using the envelope or average power tracking level.

FIG. 5 illustrates one example active bias circuit approach. In this example, a time varying supply voltage Vsupply is coupled through series resistors R1 and R2 to Vref. Vref may be modulated as described above in some embodiments. A positive terminal of an operational amplifier is coupled to a node between R1 and R2 to receive a divided voltage related to Vdd (and Vref). A negative terminal of the operational amplifier is coupled to a node between resistors R3 and R4, which are configured in series between an output of the operational amplifier and ground to form a feedback resistor divider. The operational amplifier may change (e.g., amplify or attenuate) the voltage from the resistor divider of R1/R2 to produce a gate voltage Vg to one transistor in the stack. Capacitor, C, may represent a gate capacitance, for example, alone or together with additional capacitance to store Vg. The operational amplifier output voltage Vg may be adjusted and optimized with the resister feedback network R3/R4, for example.

FIG. 6 illustrates another example of a bias circuit for generating a gate bias voltage according to an embodiment. In this example, resistors R1 and R2 are configured in series between Vdd and ground. Vref is coupled to a node between R1 and R2 through resistor R3. Vref may be a modulated supply based on Vdd, for example. Bias voltage VGN is given by:

$$V_{GN} = V_{Supply} * (R_2 \| R_3)/(R_1 + (R_2 \| R_3)) + V_{ref1} * (R_1 \| R_2)/((R_1 \| R_2) + R_3).$$

In one embodiment, the resistors in a bias circuit may be tunable. For example, referring to FIGS. 6, R1, R2, and R3 may be tunable (e.g., digitally programmable). In this example, the tunability of R1, R2, R3 can be exploited either to optimize the efficiency under different operating conditions and/or for test purposes. For example, an amplifier circuit may be configured into a test mode, for example, by opening R2 and R3 (e.g., by controlling switches to create an open circuit and remove R2 and R3 from the circuit). Referring to FIG. 1, if Vdd(t) is coupled to the gate of a stacked device via R1, then the voltage VG2 . . . VGN is maximized (e.g., Vg=Vdd). At low frequencies, inductor L is a short circuit, and the voltage at the drain of M1 may be controlled by Vdd. In this way, a DC curve of M1 can be measured in a test environment, for example.

Figure 7:
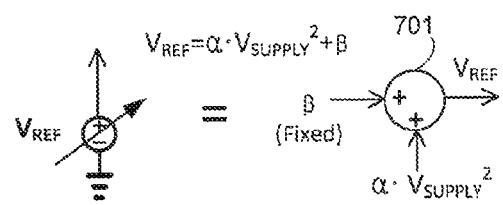
FIG. 7 illustrates modulating a voltage reference in the bias circuit according to another embodiment.

FIG. 7 illustrates modulating a voltage reference in the bias circuit according to another embodiment. One approach for modulating Vref may include basing Vref on the time varying power supply voltage, denoted here as Vsupply. In this example, Vref may be related to a time varying power supply voltage as follows:

$$Vref = \alpha * Vsupply^2 + \beta.$$

Figure 8:
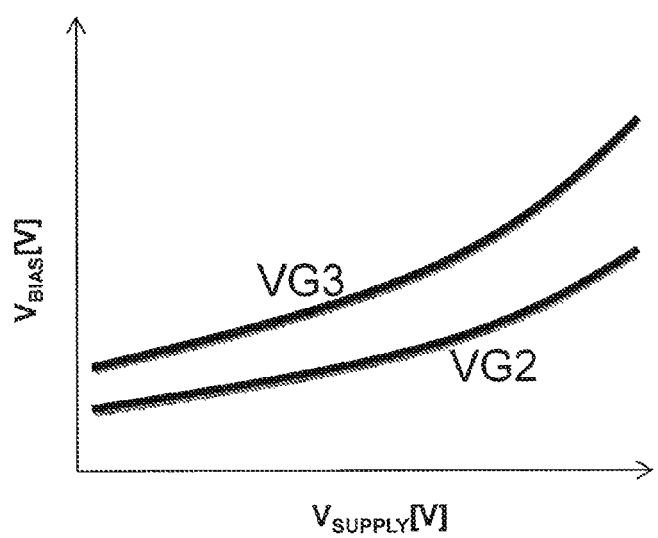
FIG. 8 illustrates examples of non-linear monotonically increasing functions according to another embodiment.

An illustrative block diagram for generating Vref is shown at 701. FIG. 8 illustrates examples of non-linear monotonically increasing functions that may be used for two gate bias circuits according to another embodiment.

Figure 9A:
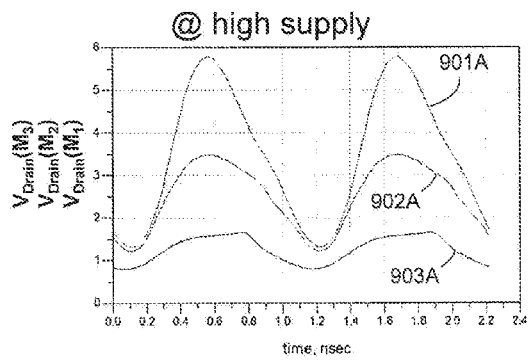
FIGS. 9A and 9B illustrate waveforms according to one example implementation.
Figure 9B:
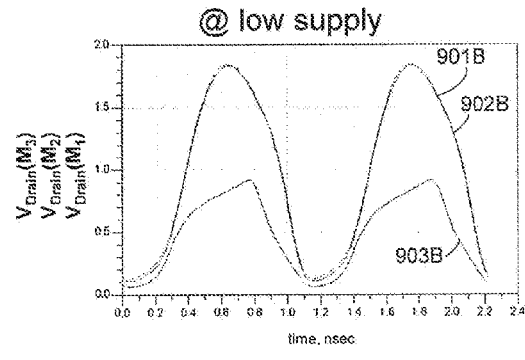

FIGS. 9A and 9B illustrate waveforms at the drains of M1, M2, and M3 for the example circuit in FIG. 3A according to one embodiment. Waveforms 901A,B are the voltages on the drain of M3, waveforms 902A,B are the voltages on the drain of M2, and waveforms 903A,B are the voltages on the drain of M1. FIG. 9A corresponds to drain voltages at high power supply voltage levels. FIG. 9A illustrates that the voltage at each drain is successively lower at high Vdd levels because the stacked devices divide the supply voltage. However, at low Vdd levels in FIG. 9B, the voltage at the drain of M3 and the drain of M2 are the approximately the same because one of the transistors (here, M3) enters the Triode region where the drain is approximately short circuited to the source, causing the voltage at the drain of M2 at 902B to be the same as the voltage at the drain of M3 at 901B, for example.

Figure 10:
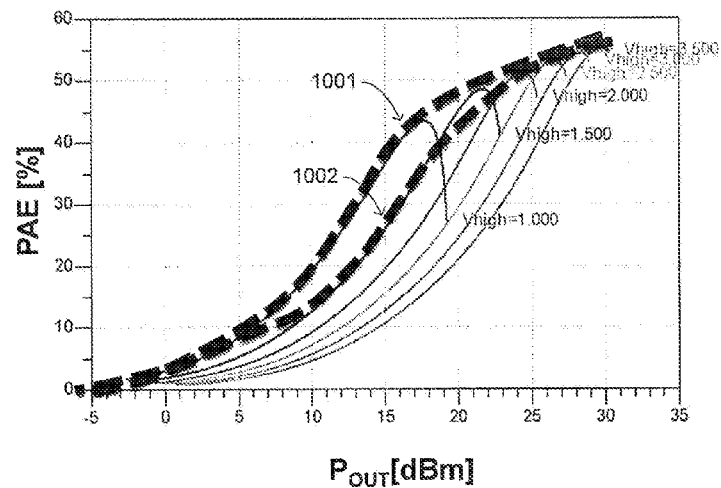
FIG. 10 shows different power added efficiency (PAE) curves for different levels of supply voltage according to one example implementation.

FIG. 10 illustrates an improvement in power added efficiency (PAE) using the above described techniques. FIG. 10 shows different PAE curves for different levels of Vdd. Line 1001 is with proposed biasing and line 1002 is with conventional biasing according to one example embodiment. Techniques described herein allow higher efficiency across a wider range of Vdd levels, which expands (broadens) the composite PAE curve, may result in a higher overall efficiency of a power amplifier, improved linearity (AM/AM), and even improved gain in some embodiments.

The above description illustrates various embodiments of the present disclosure along with examples of how aspects of the particular embodiments may be implemented. For instance, the examples shown above use CMOS transistors, but other embodiments may use different transistor types having a control terminal (e.g., a base for bipolar) and first and second terminals (e.g., a collector and emitter). The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

The invention claimed is:

1. An electronic device comprising:
    a first transistor having a control terminal configured to receive an input signal, a first terminal, and a second terminal;
    a plurality of stacked transistors, the plurality of stacked transistors arranged in series between the second terminal of the first transistor and an output node, each of the plurality of stacked transistors comprising a control terminal;
    an inductor having a first terminal coupled to the output node and a second terminal coupled to a modulated power supply, the modulated power supply producing a time varying power supply voltage;
    a bias circuit having an input coupled to the modulated power supply to receive the time varying power supply voltage, the bias circuit comprising a plurality of outputs producing a plurality of bias voltages, wherein particular outputs of the bias circuit are coupled to particular control terminals of the plurality of stacked transistors,
    wherein the power supply voltage is greater than each of the plurality of bias voltages above a first power supply voltage level, and wherein the power supply voltage and the plurality of bias voltages decrease continuously until the power supply voltage is less than each of the plurality of bias voltages below a second power supply voltage level.

2. The electronic device of claim 1 wherein as the power supply voltage decreases across a range of levels, the plurality of bias voltages converge to one or more values greater than a lowest level of the power supply voltage.

3. The electronic device of claim 2 wherein the power supply voltage is greater than all of the bias voltages across a first upper range, wherein the power supply voltage is less than all of the bias voltages across a second lower range, and wherein as the power supply voltage decreases between the first upper range and the second lower range, the power supply voltage successively becomes less than each of the plurality of bias voltages.

4. The electronic device of claim 1 wherein the time varying power supply voltage is related to the input signal to produce a particular output voltage on the output node.

5. The electronic device of claim 1 wherein one or more bias voltages change linearly as the power supply voltage changes.

6. The electronic device of claim 1 wherein one or more bias voltages increase monotonically as the power supply voltage increases.

7. The electronic device of claim 1 wherein the plurality of stacked transistors are successively biased in a low impedance triode region of operation as the power supply voltage decreases, and wherein the plurality of stacked transistors are successively biased to have an impedance greater than the low impedance triode region of operation as the power supply voltage increases.

8. The electronic device of claim 1 wherein the bias circuit comprises:
    a first resistor having a first terminal coupled to the modulated power supply and a second terminal coupled to a control terminal of one of the plurality of stacked transistors;
    a second resistor having a first terminal coupled to the control terminal of said one of the plurality of stacked transistors and a second terminal;
    a voltage reference coupled to the second terminal of the second resistor.

9. The electronic device of claim 8 the bias circuit further comprising an amplifier configured between the second terminal of the first resistor and the control terminal of said one of the plurality of stacked transistors.

10. The electronic device of claim 1 wherein the bias circuit comprises:

a first resistor having a first terminal coupled to the modulated power supply and a second terminal coupled to a control terminal of one of the plurality of stacked transistors;

a second resistor having a first terminal coupled to the control terminal of said one of the plurality of stacked transistors and a second terminal coupled to ground;

a third resistor having a first terminal coupled to the control terminal of said one of the plurality of stacked transistors and a second terminal; and a voltage reference coupled to the second terminal of the third resistor.

11. The electronic device of claim 1 wherein the bias circuit comprises a plurality of resistors coupled between the modulated power supply and ground, wherein a control terminal of one of the plurality of stacked transistors is coupled to at least one terminal of the plurality of resistors, and wherein at least one other resistor terminal is coupled to a reference voltage modulated according to the power supply voltage.

12. The electronic device of claim 11 wherein the modulated reference voltage is based on a square of the supply voltage.

13. The electronic device of claim 11 wherein the modulated reference voltage is based on a square of the supply voltage added to a constant.

14. A method comprising:

receiving an input signal on a control terminal of a first transistor, the first transistor including a second terminal coupled to a plurality of stacked transistors arranged in series between the second terminal of the first transistor and an output node, wherein each stacked transistor has a control terminal;

receiving a time varying power supply voltage from a modulated power supply on a first terminal of an inductor, the inductor having a second terminal coupled to the output node;

receiving the time varying power supply voltage in a bias circuit to produce a plurality of bias voltages, wherein particular bias voltages from the bias circuit are coupled to particular control terminals of the plurality of stacked transistors, wherein the power supply voltage is greater than each of the plurality of bias voltages above a first power supply voltage level, and wherein the power supply voltage and the plurality of bias voltages decrease continuously until the power supply voltage is less than each of the plurality of bias voltages below a second power supply voltage level.

15. The method of claim 14 wherein as the power supply voltage decreases across a range of levels, the plurality of bias voltages converge to one or more values greater than a lowest level of the power supply voltage.

16. The method of claim 15 wherein the power supply voltage is greater than all of the bias voltages across a first upper range, wherein the power supply voltage is less than all of the bias voltages across a second lower range, and wherein as the power supply voltage decreases between the first upper range and the second lower range, the power supply voltage successively becomes less than each of the plurality of bias voltages.

17. The method of claim 14 wherein one or more bias voltages change linearly as the power supply voltage changes.

18. The method of claim 14 wherein one or more bias voltages increase monotonically as the power supply voltage increases.

19. An electronic device comprising:

a first transistor having a control terminal configured to receive an input signal, a first terminal, and a second terminal;

a plurality of stacked transistors, the plurality of stacked transistors arranged in series between the second terminal of the first transistor and an output node, each of the plurality of stacked transistors comprising a control terminal;

an inductor having a first terminal coupled to the output node and a second terminal coupled to a modulated power supply, the modulated power supply producing a time varying power supply voltage;

means for receiving the time varying power supply voltage and for producing a plurality of bias voltages, wherein particular bias voltages are coupled to particular control terminals of the plurality of stacked transistors, wherein the power supply voltage is greater than each of the plurality of bias voltages above a first power supply voltage level, and wherein the power supply voltage and the plurality of bias voltages decrease continuously until the power supply voltage is less than each of the plurality of bias voltages below a second power supply voltage level.

* * * * *